US012660529B2

(12) United States Patent
Igarashi et al.

(10) Patent No.: US 12,660,529 B2
(45) Date of Patent: Jun. 16, 2026

(54) SUBSTRATE PROCESSING METHOD AND SUBSTRATE PROCESSING APPARATUS FOR CONTROLLING INTRODUCTION INTO INSULATING FILM

(71) Applicant: Tokyo Electron Limited, Tokyo (JP)

(72) Inventors: Kazumasa Igarashi, Yamanashi (JP); Jun Ogawa, Yamanashi (JP); Yuki Tanaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 357 days.

(21) Appl. No.: 18/315,066

(22) Filed: May 10, 2023

(65) Prior Publication Data

US 2023/0395371 A1 Dec. 7, 2023

(30) Foreign Application Priority Data

Jun. 6, 2022 (JP) ................................. 2022-091774

(51) Int. Cl.
*H01L 21/02* (2006.01)
*H01J 37/32* (2006.01)
*H01L 21/3115* (2006.01)
*H01L 21/67* (2006.01)
*H10P 14/60* (2026.01)
(Continued)

(52) U.S. Cl.
CPC .... *H10P 14/6518* (2026.01); *H01J 37/32449* (2013.01); *H10P 14/6532* (2026.01); *H10P 32/20* (2026.01); *H10P 72/0402* (2026.01); *H10P 72/0434* (2026.01); *H01J 2237/2001* (2013.01); *H01J 2237/338* (2013.01)

(58) Field of Classification Search
CPC ........... H01L 21/02321; H01L 21/0234; H01L 21/3115; H01L 21/67017; H01L 21/67109; H01L 21/02274; H01L 21/02164; H01J 37/32449; H01J 2237/2001; H01J 2237/338
USPC ......................................................... 438/513
See application file for complete search history.

(56) References Cited

U.S. PATENT DOCUMENTS

| 4,673,547 | A | * | 6/1987 | Iniotakis | .............. | G21C 19/303 |
| | | | | | | 376/314 |
| 2002/0090802 | A1 | * | 7/2002 | Beulens | ................ | H01L 21/223 |
| | | | | | | 438/513 |

(Continued)

FOREIGN PATENT DOCUMENTS

| JP | 2000-077621 | | 3/2000 |
| JP | 2009094348 | A * | 4/2009 |
| WO | 2021/178123 | | 9/2021 |

*Primary Examiner* — Duy T Nguyen
(74) *Attorney, Agent, or Firm* — IPUSA, PLLC

(57) ABSTRACT

A substrate processing method includes housing, in a processing container, a substrate having an insulating film on a surface of the substrate; exposing the insulating film to plasma generated from a gas including deuterium gas in a state where the substrate housed in the processing container is maintained at a first temperature, to introduce deuterium into the insulating film; and heat-treating the insulating film without exposing the insulating film to the plasma in a state where the substrate housed in the processing container is controlled to be at a second temperature that is different from the first temperature, to adjust concentration of the deuterium introduced into the insulating film.

9 Claims, 5 Drawing Sheets

(51) Int. Cl.
 H10P 32/20 (2026.01)
 H10P 72/00 (2026.01)

(56) References Cited

U.S. PATENT DOCUMENTS

2006/0099725 A1* 5/2006 Shioya ............. H01L 21/02362
257/E21.579
2010/0105192 A1* 4/2010 Akae ................. H01L 21/02337
438/758
2021/0198787 A1* 7/2021 Tonegawa ......... C23C 16/45542

* cited by examiner

SUBSTRATE PROCESSING METHOD AND SUBSTRATE PROCESSING APPARATUS FOR CONTROLLING INTRODUCTION INTO INSULATING FILM

CROSS-REFERENCE TO RELATED APPLICATION

The present application is based upon and claims the benefit of priority of Japanese Patent Application No. 2022-091774, filed on Jun. 6, 2022, the entire contents of which are incorporated herein by reference.

TECHNICAL FIELD

The present disclosure relates to a substrate processing method and a substrate processing apparatus.

BACKGROUND

There is a known technology for including deuterium at the interface between a semiconductor substrate and a gate insulating film formed on the semiconductor substrate, at a ratio greater than the ratio of deuterium and hydrogen existing in nature (see, e.g., Patent Document 1.).

Patent Document 1: Japanese Unexamined Patent Application Publication No. 2000-77621

SUMMARY

In view of the above, an aspect of the present disclosure relates to a technology that can control the amount of deuterium introduced into an insulating film.

According to one aspect of the present invention, there is provided a substrate processing method that includes housing, in a processing container, a substrate having an insulating film on a surface of the substrate; exposing the insulating film to plasma generated from a gas including deuterium gas in a state where the substrate housed in the processing container is maintained at a first temperature, to introduce deuterium into the insulating film; and heat-treating the insulating film without exposing the insulating film to the plasma in a state where the substrate housed in the processing container is controlled to be at a second temperature that is different from the first temperature, to adjust concentration of the deuterium introduced into the insulating film.

DETAILED DESCRIPTION

A non-limiting illustrative embodiment of the present disclosure is described below with reference to the accompanying drawings. In all of the accompanying drawings, the same or corresponding members or components are denoted by the same or corresponding reference symbols, and duplicate descriptions are omitted.

(Substrate Processing Method)

Figure 1:
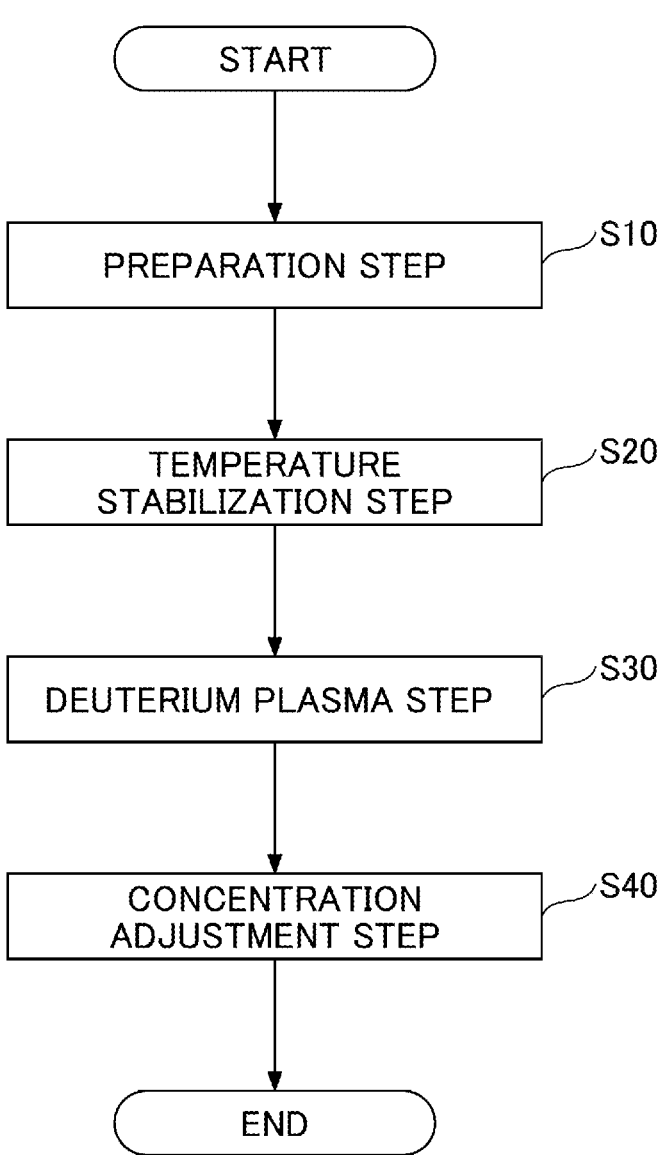
FIG. 1 is a flowchart illustrating a substrate processing method according to the embodiment.
Figure 2:
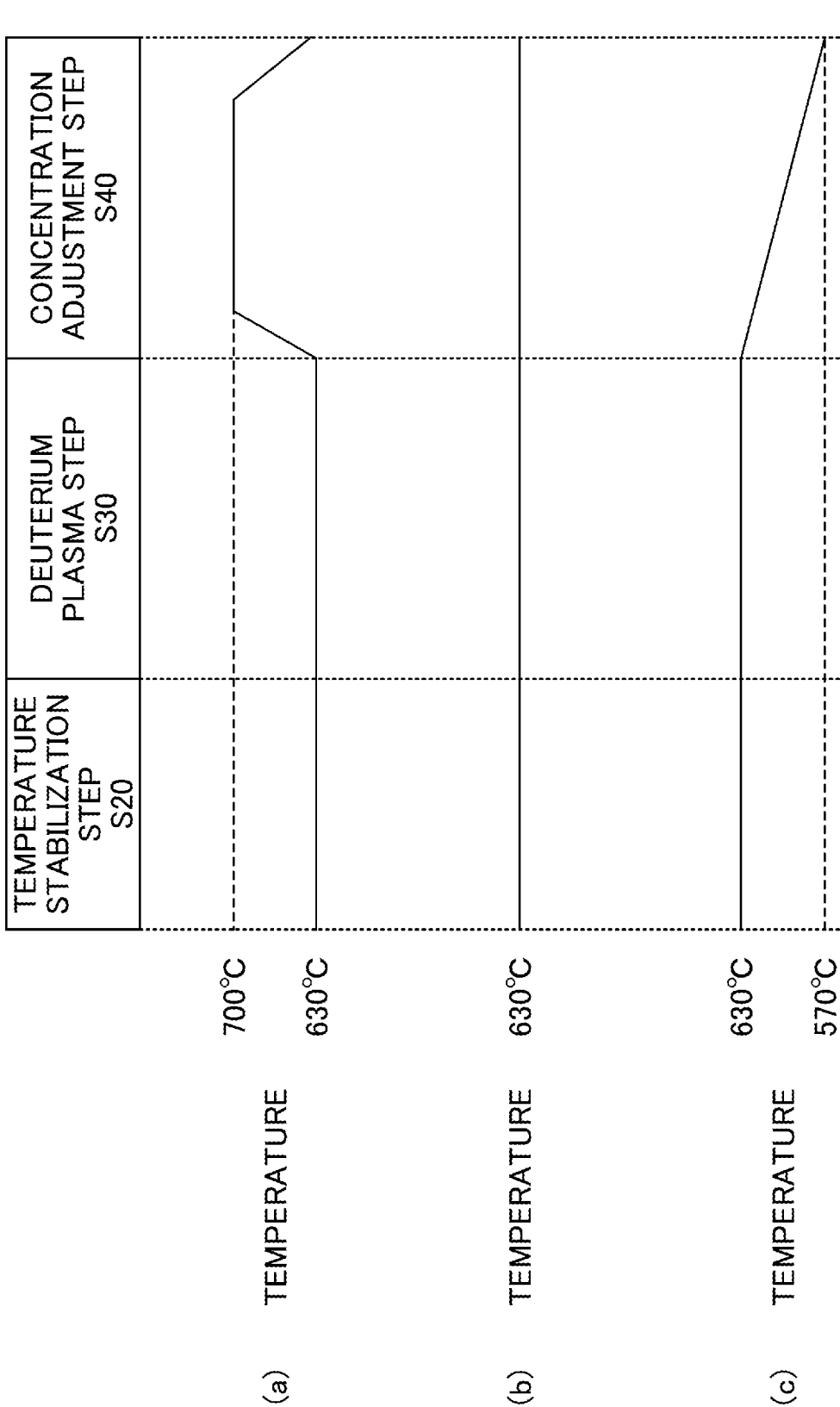
FIG. 2 is a timing chart illustrating the substrate processing method according to the embodiment.

The substrate processing method according to the embodiment will be described with reference to FIGS. 1 and 2. FIG. 1 is a flowchart illustrating the substrate processing method according to the embodiment. FIG. 2 is a timing chart illustrating the substrate processing method according to the embodiment. FIG. 2 illustrates the temperature of the substrate in each step of the substrate processing method according to the embodiment.

As illustrated in FIG. 1, the substrate processing method according to the embodiment includes a preparation step S10, a temperature stabilization step S20, a deuterium plasma step S30, and a concentration adjustment step S40.

The preparation step S10 includes preparing a substrate having an insulating film on the surface. The substrate may be, for example, a semiconductor wafer. The insulating film may be, for example, a silicon nitride film or a silicon oxynitride film.

The temperature stabilization step S20 is performed after the preparation step S10. The temperature stabilization step S20 includes stabilizing the temperature of the substrate by adjusting the temperature to a first temperature. The first temperature may be, for example, between 600 degrees Celsius and 700 degrees Celsius. In the examples (a) to (c) in FIG. 2, the first temperature is 630 degrees Celsius.

The deuterium plasma step S30 is performed after the temperature stabilization step S20. In the deuterium plasma step S30, the insulating film is exposed to the plasma generated from plasma generating gas including deuterium gas while the temperature of the substrate is maintained at the first temperature, and deuterium is introduced into the insulating film. The plasma generating gas may further include an inert gas. The inert gas may be, for example, nitrogen gas or argon gas.

The concentration adjustment step S40 is performed after the deuterium plasma step S30. The concentration adjustment step S40 includes adjusting the concentration of deuterium introduced into the insulating film by heat-treating the insulating film without exposing the insulating film to plasma, while the temperature of the substrate is controlled to a second temperature different from the first temperature. When the insulating film is heat-treated without being exposed to plasma, it is considered that the higher the temperature, the more easily the deuterium is desorbed from the insulating film. Therefore, the concentration of deuterium in the insulating film can be adjusted by heat-treating the insulating film without exposing the insulating film to plasma while the temperature of the substrate is controlled to a second temperature different from the first temperature.

The second temperature may be higher than, for example, the first temperature. In this case, the insulating film is heat-treated at a temperature higher than the first temperature, and, therefore, deuterium is more easily desorbed from the insulating film than when the insulating film is heat-treated at the first temperature. Therefore, the concentration of deuterium in the insulating film decreases. The second temperature may be lower than, for example, the first temperature. In this case, the insulating film is heat-treated at a temperature lower than the first temperature, and, therefore, deuterium is less likely to be desorbed from the insulating film than when the insulating film is heat-treated at the first temperature. Therefore, the deuterium concentration in the insulating film increases. The second temperature may be, for example, a constant temperature or a temperature that changes with time. In (a) of FIG. 2, the second temperature is 700 degrees Celsius. In (c) of FIG. 2, the second temperature is a temperature that continuously varies from 630 degrees Celsius to 570 degrees Celsius over time. In (b) of FIG. 2, the case where the second temperature is the same temperature as the first temperature is illustrated for comparison.

The second temperature may be determined, for example, based on the desired deuterium concentration. The second temperature may be determined, for example, based on the desired deuterium concentration and relational information indicating the relationship between the deuterium concentration and the second temperature. The relational information is calculated, for example, by conducting an experiment beforehand.

The concentration adjustment step S40 may include supplying deuterium gas to the substrate, for example. The concentration adjustment step S40 may be performed without supplying deuterium gas to the substrate, for example. The concentration adjustment step S40 may include supplying inert gas to the substrate, for example.

As described above, according to the substrate processing method according to the embodiment, the concentration adjustment step S40 is performed after the deuterium plasma step S30. In the deuterium plasma step S30, the insulating film is exposed to the plasma generated from the plasma generating gas including deuterium gas while the temperature of the substrate is maintained at the first temperature, and deuterium is introduced into the insulating film. In the concentration adjustment step S40, the insulating film is heat-treated without exposure to the plasma while the temperature of the substrate is controlled to a second temperature different from the first temperature, and the concentration of deuterium introduced into the insulating film is adjusted. Thus, according to the substrate processing method according to the embodiment, the amount of deuterium introduced into the insulating film can be controlled by changing the temperature of the substrate in the concentration adjustment step S40 without changing the conditions of the deuterium plasma step S30.

Incidentally, if the amount of deuterium introduced into the insulating film is to be increased, it is possible to change the conditions of the deuterium plasma step S30, such as increasing the temperature of the substrate, increasing the RF power, or increasing the time length of exposing the insulating film to deuterium plasma, etc., in the deuterium plasma step S30. However, from the viewpoint of safety, there are cases where the conditions of the deuterium plasma step S30 cannot be changed. On the other hand, the substrate processing method in the embodiment is particularly effective when the conditions of the deuterium plasma step S30 cannot be changed because the amount of deuterium introduced into the insulating film can be controlled without changing the conditions of the deuterium plasma step S30.

(Substrate Processing Apparatus)

Figure 3:
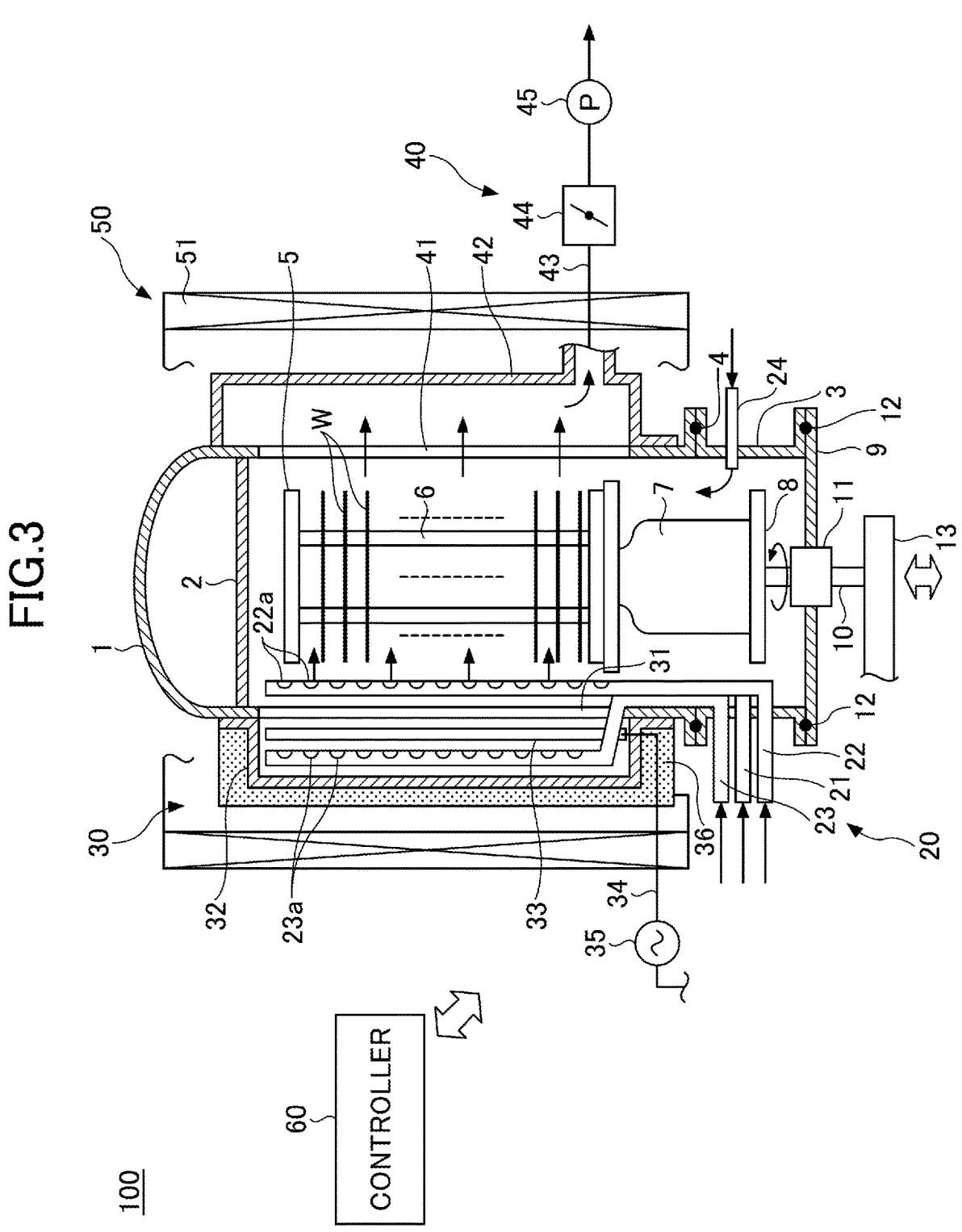
FIG. 3 is a vertical cross-sectional view illustrating a substrate processing apparatus according to the embodiment.
Figure 4:
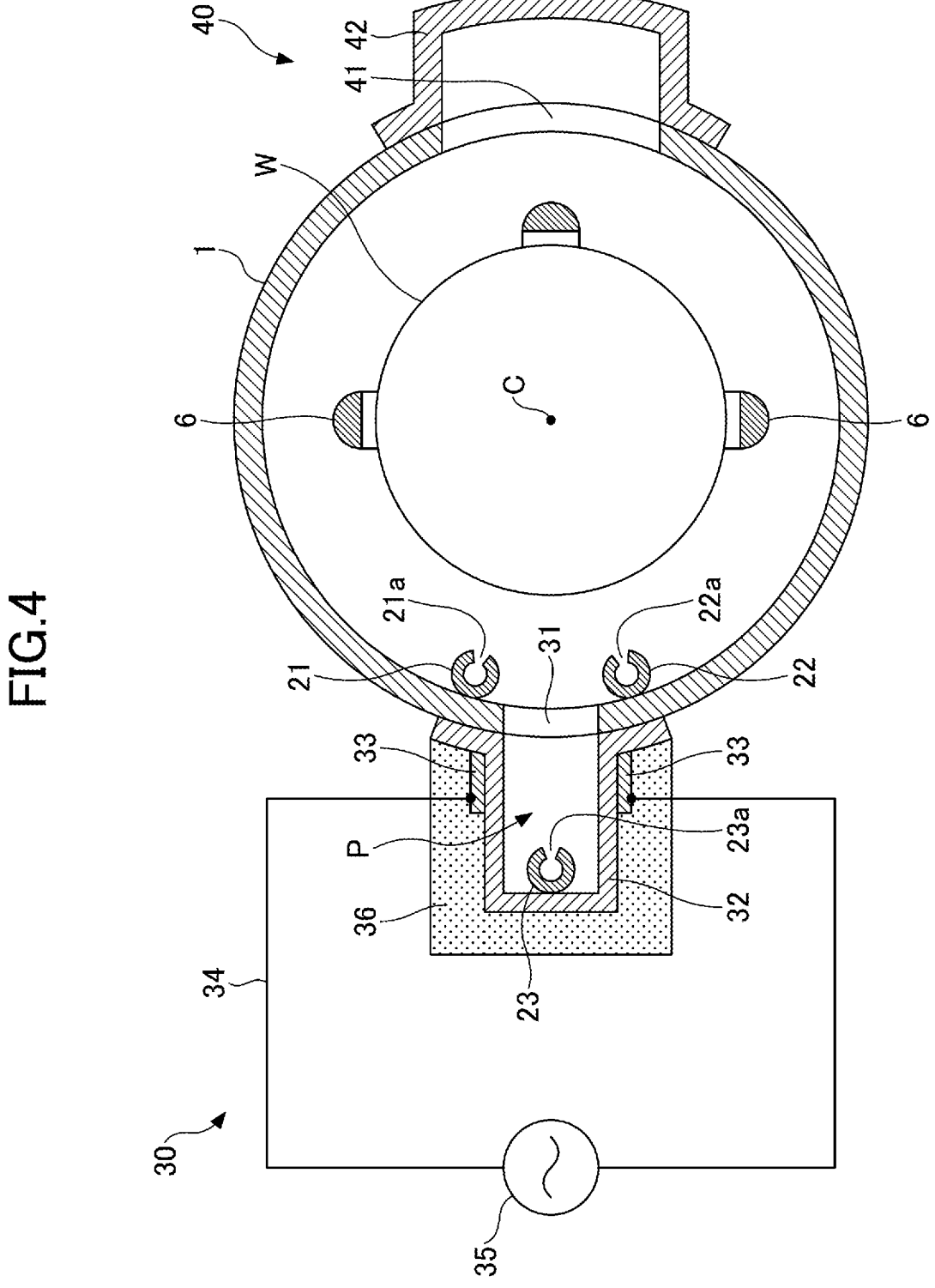
FIG. 4 is a horizontal cross-sectional view illustrating the substrate processing apparatus according to the embodiment.

A substrate processing apparatus 100 according to the embodiment will be described with reference to FIGS. 3 and 4. As illustrated in FIGS. 3 and 4, the substrate processing apparatus 100 mainly includes a processing container 1, a gas supply 20, a plasma generator 30, an exhaust unit 40, a heating unit 50, and a controller 60.

The processing container 1 has a vertical cylindrical body with a ceiling and open at the lower end. The entire processing container 1 is formed of, for example, quartz. A ceiling plate 2 is provided near the upper end of the processing container 1, and the lower area of the ceiling plate 2 is sealed. The ceiling plate 2 is formed of, for example, quartz. A manifold 3 made of metal formed in a cylindrical shape is connected to the opening at the lower end of the processing container 1 through a sealing member 4. The sealing member 4 may be, for example, an O-ring.

The manifold 3 supports the lower end of the processing container 1. A boat 5 is inserted into the processing container 1 from below the manifold 3. The boat 5 holds a plurality of (e.g., 25 to 150) substrates W approximately horizontally at intervals along the vertical direction. The substrate W may be, for example, a semiconductor wafer. The boat 5 is formed of, for example, quartz. The boat 5 has, for example, three struts 6, and multiple substrates W are supported by grooves formed on the struts 6.

The boat 5 is mounted on a turntable 8 through a heat reserving tube 7. The heat reserving tube 7 is formed of, for example, quartz. The heat reserving tube 7 prevents heat radiation from the opening at the lower end of the manifold 3. The turntable 8 is supported on a rotary shaft 10. The opening at the lower end of the manifold 3 is opened and closed by a lid 9. The lid 9 is formed of a metallic material such as stainless steel, for example. The rotary shaft 10 penetrates the lid 9.

A magnetic fluid seal 11 is provided at the penetration part of the rotary shaft 10. The magnetic fluid seal 11 airtightly seals and rotatably supports the rotary shaft 10. A seal member 12 is provided between the periphery of the lid 9 and the lower end of the manifold 3 to maintain airtightness in the processing container 1. The seal member 12 may be, for example, an O-ring.

The rotary shaft 10 is attached to the tip of an arm 13 supported by an elevating mechanism, for example, a boat elevator. When the arm 13 is raised and lowered, the boat 5, the heat reserving tube 7, the turntable 8, and the lid 9 are raised and lowered integrally with the rotary shaft, and are inserted and removed from the processing container 1.

The gas supply 20 supplies various gases into the processing container 1. The gas supply 20 has, for example, four gas nozzles 21 to 24. The gas supply 20 may have, for example, 4 gas nozzles 21 to 24 plus another gas nozzle.

The gas nozzle 21 is formed of, for example, quartz and has an L-shape that is bent upward and extends vertically, penetrating the sidewall of the manifold 3 inward. The vertical portion of the gas nozzle 21 is provided outside a plasma generation space P, for example, on the side of the plasma generation space P with respect to the center C of the processing container 1 in the processing container 1. The vertical portion of the gas nozzle 21 may be provided, for example, on the side of an exhaust port 41 with respect to the center C of the processing container 1 in the processing container 1. The gas nozzle 21 is connected to one or more supply sources of processing gas. Multiple gas holes 21a are spaced in the vertical portion of the gas nozzle 21 over the vertical length corresponding to the substrate support range of the boat 5. The gas holes 21a are oriented at the center C of the processing container 1, for example, and discharge the processing gas horizontally toward the center C of the processing container 1. The gas holes 21a, for example, may be oriented at the plasma generation space P or at the inner wall near the processing container 1.

The gas nozzle 22 is formed of quartz, for example, and has an L-shape that is bent upward and extends vertically, penetrating the sidewall of the manifold 3 inward. The vertical portion of the gas nozzle 22 is provided outside the plasma generation space P, for example, on the side of the plasma generation space P with respect to the center C of the processing container 1 in the processing container 1. The vertical portion of the gas nozzle 22 may be provided, for example, on the side of the exhaust port 41 with respect to the center C of the processing container 1 in the processing container 1. The gas nozzle 22 is connected to one or more supply sources of processing gas. Multiple gas holes 22a are formed at intervals in the vertical portion of the gas nozzle 22 over the vertical length corresponding to the substrate support range of the boat 5. The gas holes 22a are oriented at the center C of the processing container 1, for example, and discharge the processing gas horizontally toward the center C of the processing container 1. The gas holes 22a may be oriented at the plasma generation space P, for example, or at the inner wall near the processing container 1.

The gas nozzle 23 is formed of quartz, for example, and has an L-shape that is bent upward and extends vertically, penetrating the sidewall of the manifold 3 inward. The vertical part of the gas nozzle 23 is provided in the plasma generation space P. The gas nozzle 23 is connected to one or more supply sources of processing gas. The supply source of processing gas may include, for example, a supply source of deuterium gas. In the vertical portion of the gas nozzle 23, multiple gas holes 23a are formed at intervals over the vertical length corresponding to the substrate support range of the boat 5. The gas holes 23a are oriented at the center C of the processing container 1, for example, and discharge the processing gas horizontally toward the center C of the processing container 1.

The gas nozzle 24 is formed of quartz, for example, and have a straight tube shape extending horizontally penetrating through the sidewall of the manifold 3. The tip of the gas nozzle 24 is provided outside the plasma generation space P, for example, in the processing container 1. The gas nozzle 24 is connected to a supply source of purge gas. The gas nozzle 24 has an opening at the tip and supplies purge gas into the processing container 1 through the opening. As the purge gas, inert gas such as argon gas and nitrogen gas, for example, can be used.

The plasma generator 30 is provided on a part of the side wall of the processing container 1. The plasma generator 30 generates plasma from the processing gas supplied from the gas nozzle 23. The plasma generator 30 includes a plasma compartment wall 32, a pair of plasma electrodes 33, a power feed line 34, an RF power source 35, and an insulation protection cover 36.

The plasma compartment wall 32 is airtightly welded to the outer wall of the processing container 1. The plasma compartment wall 32 is formed of, for example, quartz. The plasma compartment wall 32 is recessed in the cross section and covers an opening 31 formed in the side wall of the processing container 1. The opening 31 is elongated in the vertical direction to cover all of the substrates W supported by the boat 5 in the vertical direction. The gas nozzle 23 is arranged in the plasma generation space P, which is an inner space defined by the plasma compartment wall 32 and communicating with the inside of the processing container 1. The gas nozzles 21 and 22 are provided at positions near the substrates W along the inner wall of the processing container 1 outside the plasma generation space P.

The two plasma electrodes 33 each have an elongated shape and are arranged opposite each other along the vertical direction on the outer surfaces of the walls on both sides of the plasma compartment wall 32. The power feed line 34 is connected to the lower end of each plasma electrode 33.

The power feed line 34 electrically connects each plasma electrode 33 to the RF power source 35. For example, one end of the power feed line 34 is connected to the lower end, which is the short side of each plasma electrode 33, and the other end of the power feed line 34 is connected to the RF power source 35.

The RF power source 35 is electrically connected to the lower end of each plasma electrode 33 through a power feed line 34. The RF power source 35 supplies, for example, 13.56 MHz of RF power to the pair of plasma electrodes 33. Thus, RF power is applied to the plasma generation space P defined by the plasma compartment wall 32.

The insulation protection cover 36 is attached to the outside of the plasma compartment wall 32 so as to cover the plasma compartment wall 32. A refrigerant passage (not illustrated) is provided on the inside portion of the insulation protection cover 36. The plasma electrode 33 is cooled by passing a refrigerant such as cooled nitrogen gas through the refrigerant passage. A shield (not illustrated) may be provided between the plasma electrode 33 and the insulation protection cover 36 to cover the plasma electrode 33. The shield is formed of a good conductor, such as metal, and is electrically grounded.

The exhaust unit 40 is provided in the exhaust port 41 formed in the side wall part of the processing container 1 facing the opening 31. The exhaust port 41 is formed elongated vertically corresponding to the boat 5. A cover member 42 shaped in a U-shaped cross section to cover the exhaust port 41 is attached to the part of the processing container 1 corresponding to the exhaust port 41. The cover member 42 extends upward along the side wall of the processing container 1. An exhaust pipe 43 is connected to the lower part of the cover member 42. The exhaust pipe 43 is provided with a pressure regulating valve 44 and a vacuum pump 45, in the stated order from the upstream side to the downstream side in the gas flow direction. The exhaust unit 40 operates the pressure regulating valve 44 and the vacuum pump 45 based on the control by the controller 60 to regulate the pressure in the processing container 1 by the pressure regulating valve 44 while sucking the gas in the processing container 1 to the vacuum pump 45.

The heating unit 50 includes a heater 51. The heater 51 has a cylindrical shape surrounding the processing container 1 on the outside of the processing container 1 in the radial direction. The heater 51 heats each substrate W included in the processing container 1 by heating the entire side circumference of the processing container 1.

The controller 60 controls the operation of each part of the substrate processing apparatus 100, for example. The controller 60 may be a computer, for example. Also, the program of the computer for performing the operation of each part of the substrate processing apparatus 100 is stored in a storage medium. The storage medium may be, for example, a flexible disk, a compact disk, a hard disk, a flash memory, a DVD, etc.

(Operation of Substrate Processing Apparatus)

The following describes the operation when the substrate processing method according to the embodiment is performed in the substrate processing apparatus 100.

First, the controller 60 controls the lifting mechanism to carry the boat 5 holding the multiple substrates W into the processing container 1, and the opening of the lower end of the processing container 1 is airtightly sealed by the lid 9. Each substrate W is a substrate having an insulating film on the surface thereof.

Subsequently, the controller 60 controls the exhaust unit 40 and the heating unit 50 so as to perform the temperature stabilization step S20. Specifically, first, the controller 60 controls the exhaust unit 40 to decompress the inside of the processing container 1 to a predetermined pressure and controls the heating unit 50 to adjust the temperature of the substrate W to the first temperature to stabilize the temperature of the substrate W.

Then, the controller 60 controls the gas supply 20, the plasma generator 30, the exhaust unit 40, and the heating unit 50 to execute the deuterium plasma step S30. Specifically, first, the controller 60 controls the gas supply 20 to supply deuterium gas into the processing container 1 while the temperature of the substrate W is maintained at the first temperature by controlling the heating unit, and controls the plasma generator 30 to supply RF power from the RF power source 35 to the pair of plasma electrodes 33. Thus, plasma is generated from the deuterium gas supplied into the processing container 1. As a result, the insulating film is exposed to the plasma generated from the deuterium gas, and deuterium is introduced into the insulating film.

Subsequently, the controller 60 controls the gas supply 20, the plasma generator 30, the exhaust unit 40, and the heating unit 50 so as to execute the concentration adjustment step S40. Specifically, first, the controller 60 controls the plasma generator 30 to stop the supply of RF power from the RF power source 35 to the pair of plasma electrodes 33. Then, the controller 60 controls the gas supply 20 to stop the supply of deuterium gas into the processing container 1. Further, the controller 60 controls the heating unit 50 to control the temperature of the substrate W to the second temperature. Thus, the insulating film is heat-treated without being exposed to plasma, and the concentration of deuterium introduced into the insulating film is adjusted.

Subsequently, the controller 60 raises the pressure in the processing container 1 to atmospheric pressure, lowers the temperature in the processing container 1 to the discharge temperature, and controls the lifting mechanism to discharge the boat 5 from the processing container 1.

EXAMPLE

The following describes an example in which it has been confirmed that the amount of deuterium introduced into the insulating film can be controlled by the substrate processing method according to the embodiment.

In the example, a substrate having a silicon nitride film on the surface was prepared, the prepared substrate was housed in the substrate processing apparatus 100 described above, and deuterium was introduced into the silicon nitride film under the conditions 1 to 3 described below. Then, the deuterium concentration in the silicon nitride film was measured by Secondary Ion Mass Spectrometry (SIMS). The silicon nitride film is an example of an insulating film.

(Condition 1)

In condition 1, the temperature stabilization step S20, the deuterium plasma step S30, and the concentration adjustment step S40 were performed on the prepared substrate in the stated order. In the temperature stabilization step S20 and the deuterium plasma step S30, the temperature of the substrate was maintained at 630 degrees Celsius. In the concentration adjustment step S40, the temperature of the substrate was controlled to 700 degrees Celsius, and heat treatment was performed while supplying deuterium gas and nitrogen gas into the processing container 1 without exposing the silicon nitride film to plasma.

(Condition 2)

In condition 2, in the concentration adjustment step S40, heat treatment was performed while supplying only nitrogen gas into the processing container 1 without exposing the silicon nitride film to plasma, with the temperature of the substrate controlled to 630 degrees Celsius. The other conditions are the same as in condition 1.

(Condition 3)

In condition 3, in the concentration adjustment step S40, heat treatment was performed while supplying only nitrogen gas into the processing container 1 without exposing the silicon nitride film to plasma, while continuously decreasing the temperature of the substrate from 630 to 570 degrees Celsius. The other conditions are the same as in condition 1.

Figure 5:
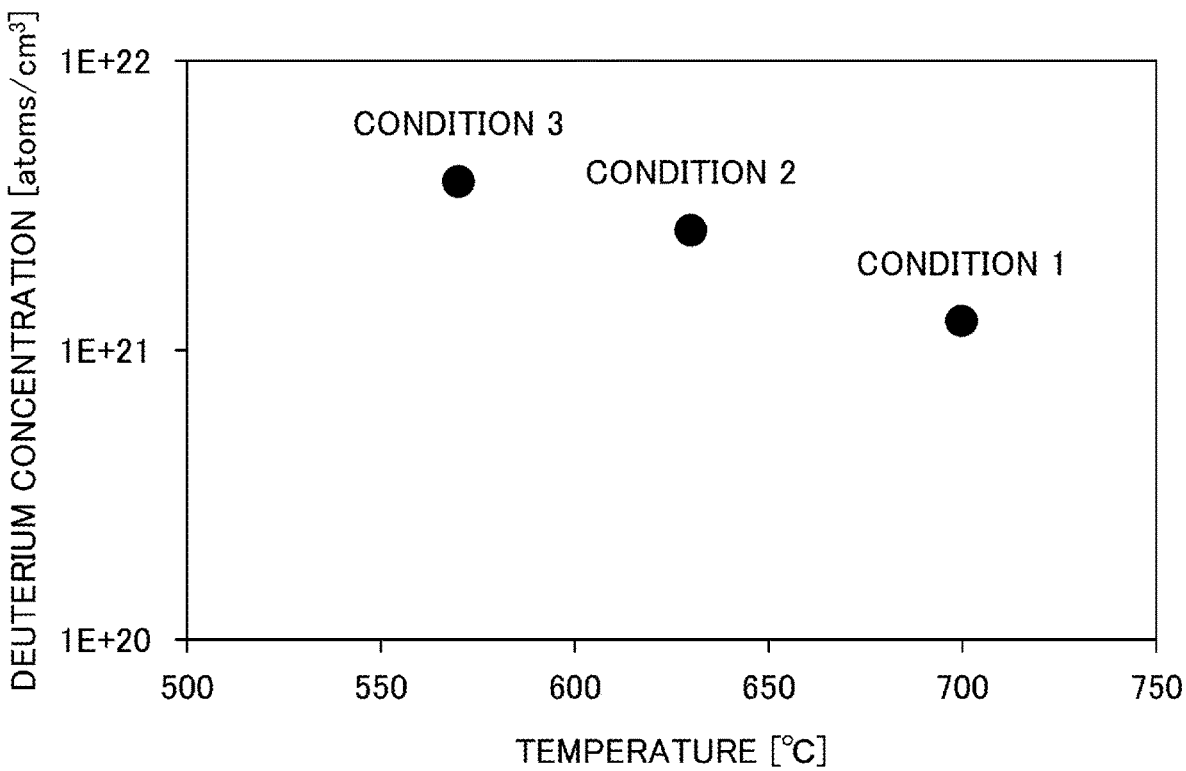
FIG. 5 illustrates the measurement results of deuterium concentration in a silicon nitride film.

FIG. 5 illustrates the result of the measurement of deuterium concentration in the silicon nitride film. FIG. 5 illustrates the deuterium concentration in the silicon nitride film in which deuterium was introduced under conditions 1 to 3. In FIG. 5, the horizontal axis indicates the temperature [degrees Celsius] of the substrate in the concentration adjustment step S40, and the vertical axis indicates the deuterium concentration [atoms/cm$^3$] in the silicon nitride film. The deuterium concentration in the silicon nitride film indicates the maximum value of the deuterium concentration in the silicon nitride film measured by SIMS in the thickness direction.

As illustrated in FIG. 5, it can be seen that the deuterium concentration in the silicon nitride film is lower in condition 1 than in condition 2. This result indicates that the deuterium concentration in the silicon nitride film can be lowered by supplying deuterium gas into the processing container 1 after the deuterium plasma step S30 while raising the temperature of the substrate higher than that of the substrate during the deuterium plasma step S30.

As illustrated in FIG. 5, it can be seen that the deuterium concentration in the silicon nitride film is higher under condition 3 than under condition 2. This result indicates that the deuterium concentration in the silicon nitride film can be increased by making the temperature of the substrate lower than that of the substrate during the deuterium plasma step S30 without supplying deuterium gas into the processing container 1 after the deuterium plasma step S30.

Based on the above example, it can be said that the amount of deuterium introduced into the silicon nitride film can be controlled by changing the temperature of the substrate and heat treating the substrate without exposing the silicon nitride film to plasma, after deuterium plasma step S30.

According to one embodiment of the present invention, it is possible to control the amount of deuterium introduced into the insulating film.

The disclosed embodiment is to be considered illustrative in all respects and not restrictive. In the above embodiment, omissions, replacements, and modifications may be made in various forms without departing from the scope and purport of the attached claims.

The above embodiment described the case where the substrate processing apparatus is a batch-type apparatus that processes multiple substrates at once, but the present disclosure is not limited to this. For example, the substrate processing apparatus may be a single-sheet apparatus that processes one substrate at a time.

The invention claimed is:

1. A substrate processing method comprising:

housing, in a processing container, a substrate having an insulating film on a surface of the substrate;

supplying deuterium gas into the processing container in which the substrate is housed;

generating plasma from the deuterium gas;

exposing the insulating film to the plasma in a state where the substrate housed in the processing container is maintained at a first temperature, to introduce deuterium into the insulating film;

extinguishing the plasma that is generated by introducing the deuterium into the insulating film; and after extinguishing the plasma, heat-treating the insulating film without exposing the insulating film to the plasma in a state where the substrate housed in the processing container is controlled to be at a second temperature that is different from the first temperature, to adjust concentration of the deuterium introduced into the insulating film.

2. The substrate processing method according to claim 1, wherein the second temperature is defined based on a desired deuterium concentration.

3. The substrate processing method according to claim 1, wherein the concentration of the deuterium is adjusted by supplying an inert gas into the processing container.

4. The substrate processing method according to claim 1, wherein the second temperature is lower than the first temperature.

5. The substrate processing method according to claim 4, wherein the concentration of the deuterium is adjusted without supplying the deuterium gas into the processing container.

6. The substrate processing method according to claim 1, wherein the second temperature is higher than the first temperature.

7. The substrate processing method according to claim 6, wherein the concentration of the deuterium is adjusted by supplying the deuterium gas into the processing container.

8. The substrate processing method according to claim 1, wherein the insulating film is a silicon nitride film.

9. A substrate processing apparatus comprising:

a processing container;

a gas supply configured to supply gas into the processing container;

a plasma generator configured to generate plasma from the gas; and a controller configured to control the gas supply and the plasma generator to execute housing, in the processing container, a substrate having an insulating film on a surface of the substrate;

supplying deuterium gas into the processing container in which the substrate is housed, the deuterium gas being the gas;

generating the plasma from the deuterium gas;

exposing the insulating film to the plasma in a state where the substrate housed in the processing container is maintained at a first temperature, to introduce deuterium into the insulating film;

extinguishing plasma that is generated by introducing the deuterium into the insulating film; and after extinguishing the plasma, heat-treating the insulating film without exposing the insulating film to the plasma in a state where the substrate housed in the processing container is controlled to be at a second temperature that is different from the first temperature, to adjust concentration of the deuterium introduced into the insulating film.

* * * * *